(12) United States Patent  
Davis

(10) Patent No.: US 6,418,152 B1  
(45) Date of Patent: Jul. 9, 2002

(54) MULTI-AMPLIFIER, HIGH POWER MODE LOCKED LASER

(75) Inventor: Richard L. Davis, Redondo Beach, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/507,396

(22) Filed: Feb. 18, 2000

(51) Int. Cl.[7] .............................. H01S 3/098; H01S 3/10; H01S 5/00; H01S 3/08
(52) U.S. Cl. .............................. 372/18; 372/26; 372/43; 372/101; 372/102; 372/108
(58) Field of Search .............................. 372/18, 23, 26, 372/30, 43, 49, 54, 73, 75, 101, 102, 108

(56) References Cited

U.S. PATENT DOCUMENTS

| | | |
|---|---|---|
| 3,978,429 A | 8/1976 | Ippen et al. |
| 4,019,156 A | 4/1977 | Fountain et al. |
| 4,435,809 A | 3/1984 | Tsang et al. |
| 4,665,524 A | 5/1987 | Cotter et al. |
| 5,570,226 A * | 10/1996 | Ota .............................. 359/333 |
| 5,764,679 A | 6/1998 | Shen et al. |
| 5,802,084 A | 9/1998 | Bowers et al. |
| 5,812,308 A | 9/1998 | Kafka et al. |
| 5,898,716 A | 4/1999 | Ahn et al. |
| 5,903,691 A | 5/1999 | Wisseman et al. |

OTHER PUBLICATIONS

"Integrated Optics END by END Multiplexer on Silicon" by Dragone, et al. *IEEE Photonics Technology Letters*, vol. 3, pp. 896–899, 1991.

"Distributed Bragg Deflector: A Multifunction Integrated Optical Device", by Stoll, *Applied Optics*, vol. 17, No. 16, Aug. 15, 1978.

* cited by examiner

Primary Examiner—Paul Ip  
Assistant Examiner—Armando Rodriquez  
(74) Attorney, Agent, or Firm—Katten Muchin Zavis

(57) ABSTRACT

A mode locked semiconductor laser that can generate relatively high-power output pulses. The semiconductor mode locked laser is formed from an array of optical amplifiers that are coupled to a common resonant cavity by way of an optical channelizer or wavelength division multiplexer (WDM). By utilizing an array of optical amplifiers, the output pulses will have a relatively higher power than known mode locked lasers. As such, the mode locked semiconductor laser in accordance with the present invention does not depend on the power handling capability of the individual optical amplifiers and allows the average output power to be scaled, for example, up to the kilowatt range using semiconductor optical amplifiers. A mode locked laser in accordance with the present invention can be implemented with active mode locking, passive mode locking or a hybrid of the two. In embodiments utilizing active mode locking, the output pulse shape can be tailored by the amplifier drive current distribution.

18 Claims, 3 Drawing Sheets

MULTI-AMPLIFIER, HIGH POWER MODE LOCKED LASER

This invention was made with Government support under contract number F30602-C-96-0273 awarded by the U.S. Air Force. The Government has certain rights in this invention.

BACKGROUND OF THE INVENTION

1. Field of the Invention

The present invention relates to a mode locked lasers and more particularly to a mode locked laser that can be used to produce relatively high-power output pulses which includes a plurality of optical amplifiers coupled to a common resonant cavity.

2. Description of the Prior Art

Mode locked lasers (MLL) are generally known in the art. Examples of such MLLs are disclosed in U.S. Pat. Nos. 3,978,429; 4,019,156; 4,435,809; 4,665,524; 5,764,679; 5,802,084; and 5,812,308. Such MLLs are used in various optical signal processing applications as well as in relatively high-speed optical communication systems. Such MLLs generate a periodic series of output pulses whose repetition rate is related to the round-trip pulse transit time within the laser cavity.

Various types of laser mode locking are known; such as active, passive and hybrid mode locking. An example of an active mode locked laser is disclosed in U.S. Pat. No. 4,019,156, while passive mode locked lasers are disclosed in U.S. Pat. Nos. 3,978,429 and 4,435,809. Active mode locking accomplished by way of an external modulation circuit which has a repetition rate or frequency which matches the laser round-trip cavity length. For example, an electrical pulse train can be applied to a laser diode, wherein the frequency of the pulse train is related to the round-trip cavity length. An example, of a passive laser is disclosed in U.S. Pat. No. 3,978,429. Such passive mode locked lasers are known to include a saturable reactor within the resonant cavity. Hybrid mode locked lasers are also known. An example of hybrid mode locked laser is disclosed in U.S. Pat. No. 4,019,156.

Semiconductor diode lasers are known to be used in such MLLs for optical signal processing as well as optical communication systems. Unfortunately, the output power of such semiconductor diode lasers is rather limited. In order to increase the output power of such mode locked lasers, post amplification is used. More particularly, an optical amplifier is disposed in the laser cavity and operated in such a manner that a large number of longitudinal cavity modes are mutually coupled together to achieve phase coherence. For example, U.S. Pat. No. 5,802,084 discloses a mode locked semiconductor laser combined with a tapered semiconductor optical amplifier, whose input is optically coupled to the output of the mode locked semiconductor laser. The tapered semiconductor optical amplifier increases the power output in order to provide relatively short high-peak power pulses. Unfortunately, the maximum pulse energy is limited to the peak power handling capability of the optical amplifier. Thus, there is a need for a semiconductor mode locked laser with increased power output pulses that does not depend on the power handling capability of an optical amplifier.

SUMMARY OF THE INVENTION

The present invention relates to a mode locked semiconductor laser that can generate relatively high-power output pulses. The semiconductor mode locked laser is formed from an array of optical amplifiers that are coupled to a common resonant cavity by way of an optical channelizer or wavelength division multiplexer (WDM). By utilizing an array of optical amplifiers, the output pulses will have a relatively higher power than known mode locked lasers. As such, the mode locked semiconductor laser in accordance with the present invention does not depend on the power handling capability of an individual optical amplifier and allows the average output power to be scaled, for example, up to the kilowatt range using a plurality of semiconductor optical amplifiers. A mode locked laser in accordance with the present invention can be implemented with active mode locking, passive mode locking or a hybrid of the two. The output pulse shape can be tailored by the amplifier drive current distribution.

BRIEF DESCRIPTION OF THE DRAWINGS

These an other advantages of the present invention will be readily apparent with reference to the following specification and attached drawings wherein.

DETAILED DESCRIPTION

The present invention relates to a semiconductor mode locked laser that is adapted to generate output pulses with relatively high output power relative to known semiconductor mode locked lasers. In accordance with the present invention. the semiconductor mode locked laser utilizes an array of semiconductor laser amplifiers, coupled to a common resonant cavity by way of an optical channelizer to provide high-power output pulses that are scalable to the kilowatt range using semiconductor optical amplifiers. Unlike known semiconductor mode locked lasers, the power output of the semiconductor mode locked laser in accordance with the present invention does not depend on the power handling capabilities of a single optical amplifier. In addition to generating output pulses with relatively high output power, the semiconductor mode locked laser in accordance with the present invention offers other advantages such as the ability to relatively easily control the output pulse shape as well as vary the pulse repetition rate.

Figure 1:
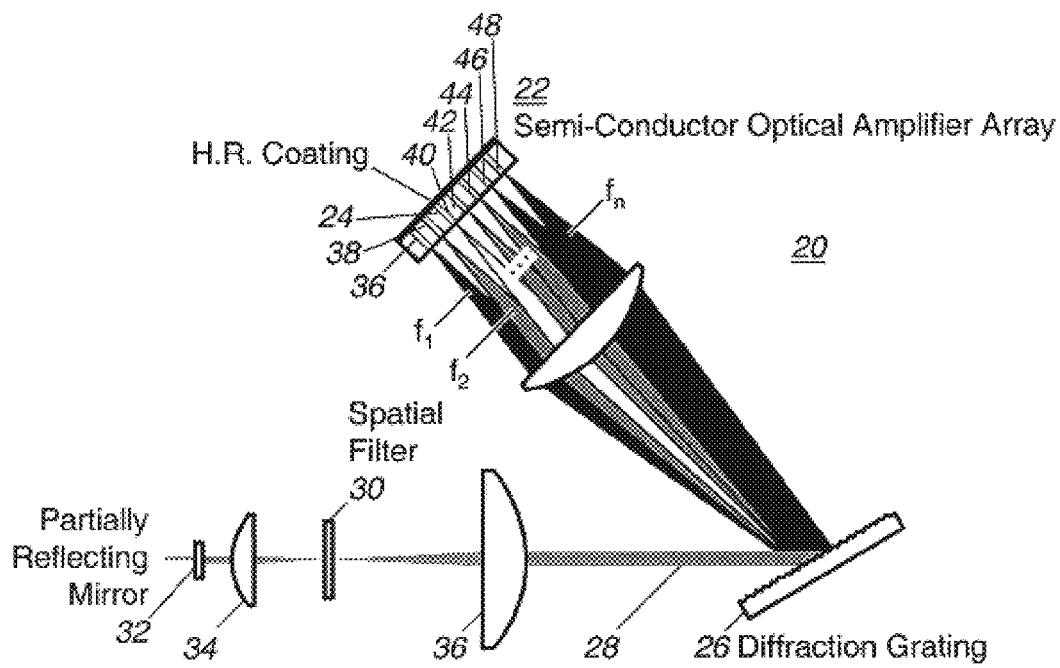
FIG. 1 is a block diagram of the mode locked laser in accordance with the present invention.

Referring to FIG. 1, a semiconductor mode locked laser in accordance with the present invention is illustrated and generally identified with the reference numeral 20. The semiconductor mode locked laser 20 includes a semiconductor optical amplifier array 22, for example, a 1×n array 22; for example, as disclosed in M. Zirngibl, et al., "An 18-Channel Multifrequency Laser," *IEEE Photonics Technology Letters*, vol. 8, p. 870 (1996), hereby incorporated by reference. The back ends of the individual amplifiers forming the array 22 are coated with a highly reflective coating 24, such as multiple alternating layers of $S_iO_x$ and $S_i$. The output pulses from the individual semiconductor optical amplifiers are coupled to a common cavity by way of an optical frequency channelizer or wavelength division multiplexer device 26. As shown in FIG. 1, a diffraction grating may be used as an optical frequency channelizer. However, other optical frequency channelizers are contemplated by the present invention including array waveguide gratings as disclosed in "Integrated Optics End by End Multiplexer on Silicon" by Dragone, et al.," *IEEE Photonics Technology Letters*, vol. 3, pp. 896–899, 1991, as well as distributed Bragg deflectors, as disclosed in "Distributed Bragg Deflector: A Multifunction Integrated Optical Device," by Stoll, *Applied Optics*, vol. 17, No. 16, Aug. 15, 1978, hereby incorporated by reference.

The optical channelizer 26 passes a single common output, generally identified as the beam 28 to a partially reflecting output mirror 32. In order to optimize the beam diameter of the optical signals at the output mirror 32, a symmetric lens system and a spatial filter 30 may be disposed between the optical channelizer 26 and the output mirror 32. The symmetric lens system may be, for example, a pair of plano-convex lenses 34 and 36, disposed such that the planar faces are facing each other and disposed on opposing sides of a spatial filter 30. The spatial filter serves to cause each of the individual laser amplifiers to lase at only the single frequency, $f_i$. For example, owing to the dispersive nature of the channelizer or WDM device, frequencies other than $f_i$ will be partially or totally blocked by the spatial filter, thereby suppressing lasing action at those frequencies.

The optical cavity is defined between the partially output mirror 32 and the reflective coating 24 on the backside of the semiconductor optical amplifier array 22. With such configuration, all of the individual laser amplifiers forming the semiconductor optical amplifier array 22 are forced to lase at a single frequency $f_i$. In addition, the output frequencies of each of the semiconductor amplifiers forming the array 24 are related by a common difference frequency $\Delta f$. For example, referring to FIG. 1 the semiconductor optical amplifier array 24 is shown with an exemplary number of seven optical amplifiers 36, 38, 40, 42, 44 and 46. Assuming the semiconductor optical amplifier 36 has a frequency $f_1=f_i$, then the frequency output of the adjacent semiconductor optical amplifier 38 will be $f_i+\Delta f=f_2$. Similarly, the frequency output of the next semiconductor optical amplifier 40 will be $f_3=f_2+\Delta f$, etc. The individual lasing frequencies and the common difference frequency are determined by the design of the optical channelizer 26.

Figure 2:
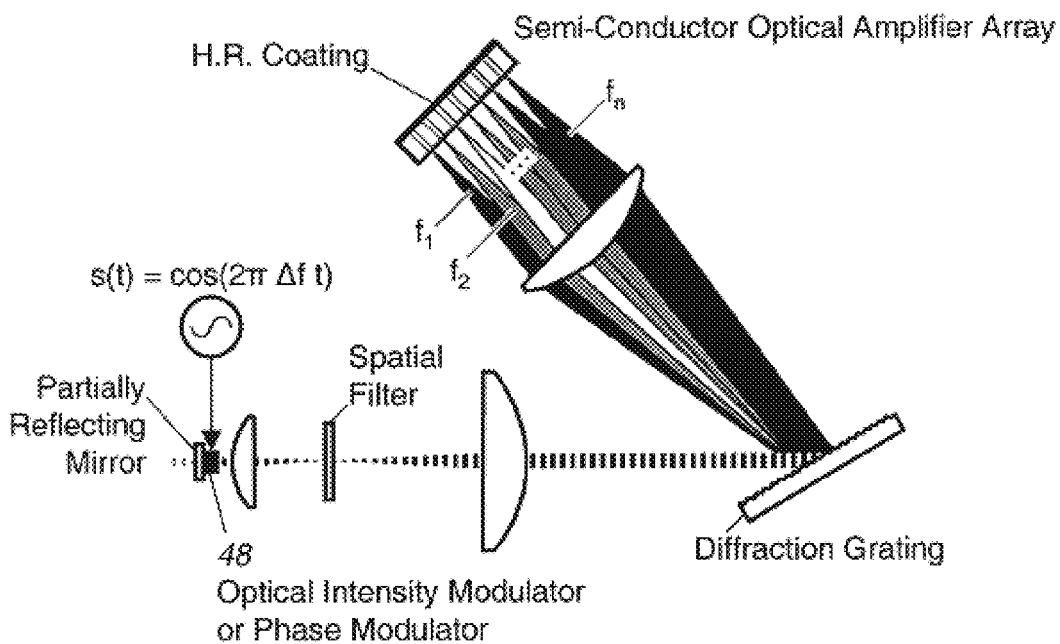
FIG. 2 is similar to FIG. 1 but illustrates the use of an optical intensity modulator at the output mirror.

In order to phase lock the individual semiconductor optical laser amplifiers 36–46 forming the semiconductor optical amplifier array 22, the reflectance of the output mirror 32 is modulated, for example, as illustrated in FIG. 2, by way of an optical intensity or phase modulator 48. Such optical intensity and phase modulators are known in the art. Examples of suitable optical intensity and phase modulators for use in the present invention is disclosed in L. Lembo, et al., "Optical Electroabsorption Modulators for Wideband, Linear, Low-Insertion Loss Photonic Links," Proc. SPIE, vol. 2481, p. 185 (1995).

Figure 3:
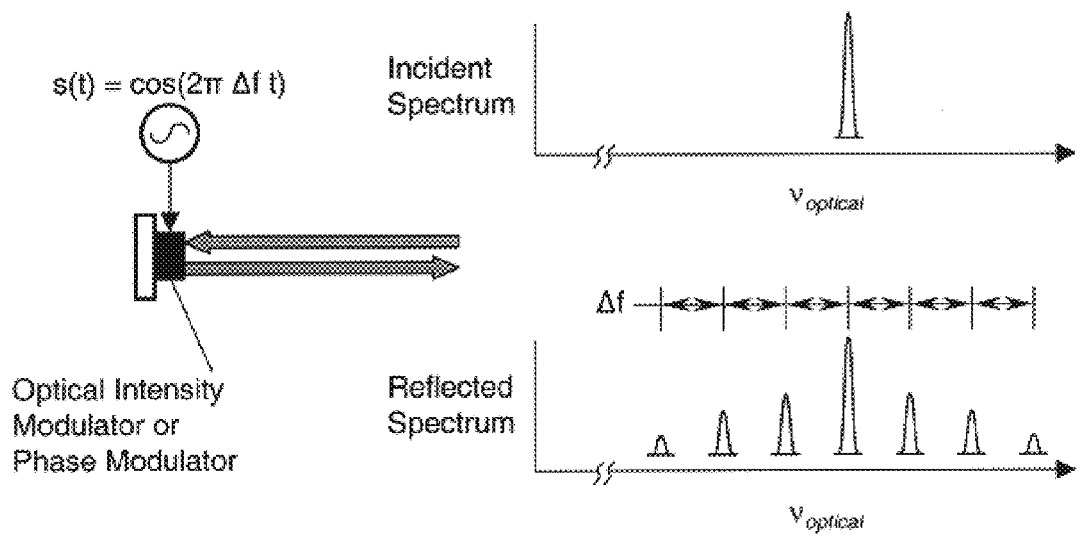
FIG. 3 is a diagram illustrating the incident spectrum and the reflective spectrum on the output mirror as a result of the optical intensity modulator.
Figure 4:
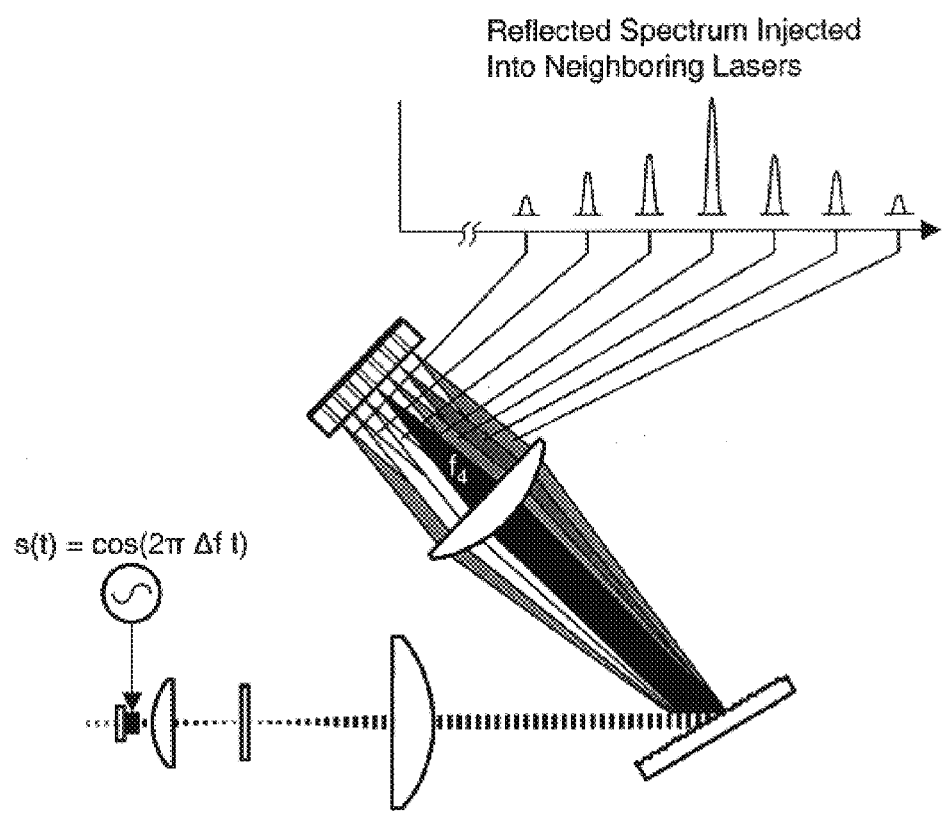
FIG. 4 is similar to FIG. 2 but illustrates the injection of reflected spectrum into neighboring lasers.

As shown, the optical intensity modulator 48 is optically coupled to the partially reflecting output mirror 32. The optical intensity modulator 48 is driven by a signal; $s(t)=\cos(2\pi\Delta ft)$, which, in effect, modulates the reflectance of the output mirror 24 at a frequency equal to $\Delta f$. As shown in FIG. 3, the effect of the modulation is to generate sidebands on the reflected optical carriers at integral multiples of $\Delta f$. These sidebands, in turn, are coupled to the neighboring laser amplifiers by the optical channelizer 26. For example, consider the amplifier 42, its reflected spectrum will consist of $f_4$, $f_4\pm\Delta f$, $f_4\pm2\Delta f$, $f_4\pm3\Delta f$, etc. The frequency $f_4$ will couple into laser 42, while $f_4-\Delta f$ couple into laser 40; $f_4+\Delta f=f_5$ will couple into laser 38 etc. as generally shown in FIG. 4. The effect of injecting the sidebands into the other lasers is to lock the lasers to the injected signal in order to force the lasers to become phase coherent with each other. Depending on the particular modulation scheme, each laser amplifier will influence some number of its nearest neighbors. In this way all of the lasers will be mutually phase coherent.

The output of the laser will be a pulse train of $\Delta f$ pulses per second. The total number of individual lasers coupled to the cavity N will in large part determine the pulse width. In general, the pulse width is approximately $\Delta t=1/(N\ \Delta f)$. The output at the output mirror is given by the following equation: $E_{OUT}(t)=\Sigma E_n \cos[2\pi](f_0+n\ \Delta f)t$, where the summation is over the total of lasers N and $E_n$ is the field amplitude of the nth laser.

Figure 5A:
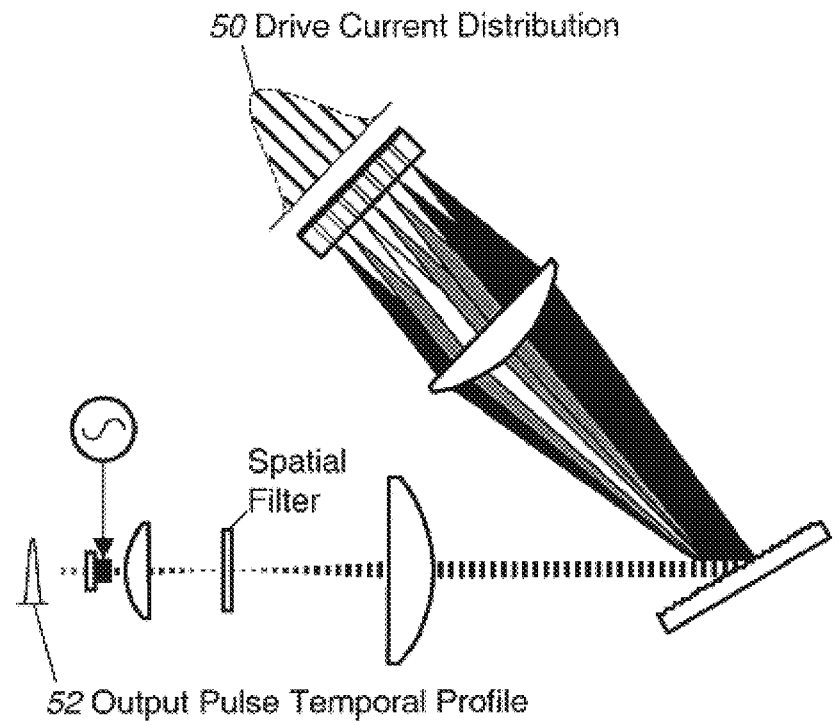
FIG. 5A is similar to FIG. 2 which illustrates a Gaussian drive current distribution and the output pulse temporal profile.
Figure 5B:
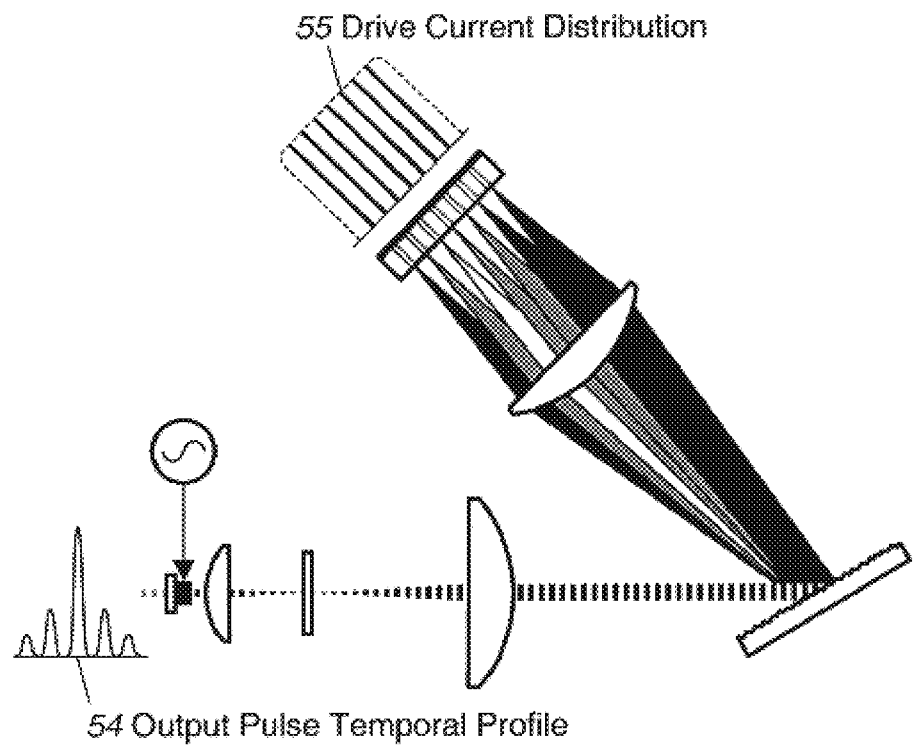
FIG. 5B is similar to FIG. 5A except for a uniform drive current distribution.

In accordance with another important aspect of the invention, profiling of the current amplitudes applied to various lasers, allows the output pulse to be shaped. For example, FIGS. 5A and 5B illustrate a relatively simple method for varying the output pulse shapes. As shown in FIG. 5A, the drive current distribution applied to the laser amplifier 22 has a generally Gaussian shape as generally illustrated by the envelope 50. In particular, the amplitudes of the drive currents applied to the individual laser amplifiers are varied so as to have a Gaussian envelope as generally shown in FIG. 5A. With such a drive current distribution, the temporal profile of output pulse 52 will be a single output pulse with no sideloads.

FIG. 5B illustrates an output pulse generally identified with the reference numeral 54 in which the drive current distribution to the semiconductor optical amplifier array has a generally uniform envelope, generally identified with the reference numeral 54. In this application, equal-amplitude D.C. drive currents are applied to all of the individual laser amplifiers in the semiconductor optical amplifier array 22. A temporal profile of the output pulse includes a relatively high output power pulse with multiple sidelobes. Other temporal profiles can be generated by varying the drive current distribution.

The above-identified invention illustrated in FIGS. 2–5 utilizes active mode locking by way of the optical intensity modulator at the output mirror 24. However, the principles of the present invention are also applicable to the embodiments in utilizing passive mode locking as well as hybrid mode locking for a combination of active and passive mode blocking is utilized. For passive mode locking, the optical intensity modulator 48 at the output mirror 24 is replaced by a saturable absorber, for example, as disclosed in P. Delfyett, et al., "Intracavity Spectral Shaping in External Cavity Mode-Locked Semiconductor Diode Lasers," IEEE J. of Selected Topics in Quant. Elect., vol. 4, p. 216 (1998), hereby incorporated by reference. The saturable absorber is used to bleach at a suitable optical intensity level, the saturation intensity. The effective saturation intensity can also be controlled by adjusting the expansion ratio of the lens combination in the output beam path. If the saturable absorber has an intrinsically low-saturation intensity, the beam incident on the absorber can be made large in diameter to compensate. Conversely, the beam can be reduced in diameter if the absorber has high-saturation intensity.

The pulse repetition rate for the semiconductor mode locked laser is determined by the physical layout of the optical channelizer. As shown, the grating channelizer is characterized by the grating's angular dispersion $\delta$ which relates the change in a defracted beam direction $\Delta\theta$ to a corresponding change in optical frequency $\Delta f$. The desired $\Delta f$ is set by the focal length of the collimating lens, $f_1$, and the amplifier spacing, $\Delta x$, through the relationship $\Delta f = \Delta x/(f_1+\delta)$. The pulse rate $\Delta f$ can be controlled by changing either $\Delta x$ or $f_1$. Tuning can be accomplished by attaching the amplifier array to a piezoelectric substrate (not shown). By applying the voltage to the substrate, the array can be stretched or compressed slightly. Larger changes to a pulse rate can be achieved by zooming the collimating lens.

Obviously, many modifications and variations of the present invention are possible in light of the above teachings. Thus, it is to be understood that, within the scope of the appended claims, the invention may be practiced otherwise than as specifically described above.

What is claimed and desired to be covered by a Letters Patent is as follows:

1. A mode locked laser comprising:
   a semiconductor optical amplifier array having a plurality of optical amplifiers and lasers defining a plurality of optical signals;
   a lens for collimating said plurality of optical signals;
   an optical channelizer disposed in the beam path of said collimating lens for channelizing said optical signals from said collimating lens;
   a partially reflecting mirror disposed to receive optical signals from said optical channelizer; and
   a modulator for modulating the output of said partially reflecting mirror.

2. The mode locked laser as recited in claim 1, wherein said optical channelizer is a diffraction grating.

3. The mode locked laser as recited in claim 1, wherein said optical channelizer is a wavelength division multiplexer.

4. The mode locked laser as recited in claim 1, wherein said optical channelizer is an arrayed waveguide grating.

5. The mode locked laser as recited in claim 1, wherein said optical channelizer is a distributed Bragg deflector.

6. The mode locked laser as recited in claim 1, wherein said modulator is an intensity modulator.

7. The mode locked laser as recited in claim 1, wherein said modulator is a phase modulator.

8. A mode locked laser comprising:
   a semiconductor optical amplifier array having a plurality of optical amplifiers and lasers defining a plurality of optical signals;
   a lens for collimating said plurality of said optical signals;
   an optical channelizer disposed in the beam path of said collimating lens for channelizing said optical signals from collimating lens;
   a partially reflecting mirror disposed to receive optical signals from said optical channelizer;
   a modulator for modulating the output of said partially reflecting mirror; and
   means for varying the temporal profile of the output light pulses from said partially reflecting mirror.

9. The mode locked laser as recited in claim 8, wherein said varying means includes means for applying different current intensity envelopes to said semiconductor optical amplifier array.

10. A mode locked laser comprising:
    a semiconductor optical amplifier array having a plurality of optical amplifiers and lasers defining a plurality of optical signals;
    a lens for collimating said plurality of said optical signals;
    an optical channelizer disposed in the beam path of said collimating lens for channelizing said optical signals from collimating lens;
    a partially reflecting mirror disposed to receive optical signals from said optical channelizer;
    a modulator for modulating the output of said partially reflecting mirror; and
    a symmetrical lens system disposed between said optical channelizer and said partially reflecting output mirror.

11. The mode locked laser as recited in claim 10, further including a spatial filter disposed adjacent said symmetrical lens system.

12. The mode locked laser as recited in claim 1, further including a highly reflective coating on the backs of said laser amplifiers.

13. A mode locked laser comprising:
    a semiconductor optical amplifier array having a plurality of optical amplifiers and lasers defining a plurality of optical signals;
    a lens for collimating said plurality of optical signals;
    an optical channelizer disposed in the beam path of said collimating lens for channelizing said optical signals from said collimating lens;
    a partially reflecting output mirror disposed to receive optical signals from said optical channelizer; and
    a saturable absorber, disposed adjacent said output mirror.

14. The mode locked laser as recited in claim 13, wherein said optical channelizer is a diffraction grating.

15. The mode locked laser as recited in claim 13, wherein said optical channelizer is a wavelength division multiplexer.

16. The mode locked laser as recited in claim 13, wherein said optical channelizer is an arrayed waveguide grating.

17. The mode locked laser as recited in claim 13, wherein said optical channelizer is a distributed Bragg deflector.

18. The mode locked laser as recited in claim 13, wherein said modulator is an intensity modulator.

* * * * *